United States Patent
Ando et al.

(10) Patent No.: US 8,109,751 B2
(45) Date of Patent: Feb. 7, 2012

(54) IMPRINT DEVICE AND MICROSTRUCTURE TRANSFER METHOD

(75) Inventors: Takashi Ando, Ibaraki (JP); Susumu Komoriya, Saitama (JP); Masahiko Ogino, Ibaraki (JP); Akihiro Miyauchi, Ibaraki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 122 days.

(21) Appl. No.: 11/774,244

(22) Filed: Jul. 6, 2007

(65) Prior Publication Data

US 2008/0042319 A1 Feb. 21, 2008

(30) Foreign Application Priority Data

Jul. 7, 2006 (JP) ................................ 2006-187958

(51) Int. Cl.
*B28B 11/08* (2006.01)
(52) U.S. Cl. .................... 425/385; 264/319; 264/293
(58) Field of Classification Search .................. 425/457; 264/293, 1.33, 1.36, 1.38, 299, 300, 319
See application file for complete search history.

(56) References Cited

U.S. PATENT DOCUMENTS

| 5,480,596 | A | * | 1/1996 | Okubo et al. | ............... 264/1.33 |
| 6,482,742 | B1 | * | 11/2002 | Chou | ............... 438/690 |
| 6,696,220 | B2 | | 2/2004 | Bailey et al. | |
| 6,748,865 | B2 | * | 6/2004 | Sakurai et al. | ............... 101/483 |
| 6,983,092 | B2 | * | 1/2006 | Kondo | ............... 385/49 |
| 2003/0189273 | A1 | * | 10/2003 | Olsson | ............... 264/293 |
| 2004/0200368 | A1 | * | 10/2004 | Ogino et al. | ............... 101/34 |
| 2005/0048154 | A1 | * | 3/2005 | Umada et al. | ............... 425/174.4 |
| 2005/0191419 | A1 | * | 9/2005 | Helt | ............... 427/256 |
| 2006/0286193 | A1 | * | 12/2006 | Ando et al. | ............... 425/385 |

FOREIGN PATENT DOCUMENTS

| JP | 2003-157520 | 5/2003 |
| JP | 2004-50813 | 2/2004 |
| JP | 2004-288845 | 10/2004 |
| JP | 2005-038596 | 2/2005 |
| JP | 2005-052841 | 3/2005 |
| JP | 2005-268675 | 9/2005 |

* cited by examiner

*Primary Examiner* — Matthew Daniels
*Assistant Examiner* — Yana Belyaev
(74) *Attorney, Agent, or Firm* — Antonelli, Terry, Stout & Kraus, LLP.

(57) ABSTRACT

There is provided an imprint device for transferring a fine pattern to a material to form a patterned material. The device comprises a stamper having the fine pattern thereon, and a pressure distribution mechanism. The stamper is pressed against the material, and the pressure distribution mechanism provides a nonuniform pressure distribution in a patterned region of the patterned material, while the stamper is in contact with the material. There are provided an imprint device and a microstructure transfer method, by which it is possible to sufficiently spread a resin or other material for forming a pattern layer between a stamper and a patterned material with a lower pressure so as not to damage the stamper or the patterned material, and to form a pattern formation layer having the uniform thickness on the patterned material.

24 Claims, 11 Drawing Sheets

FIG.2
FIG.2A
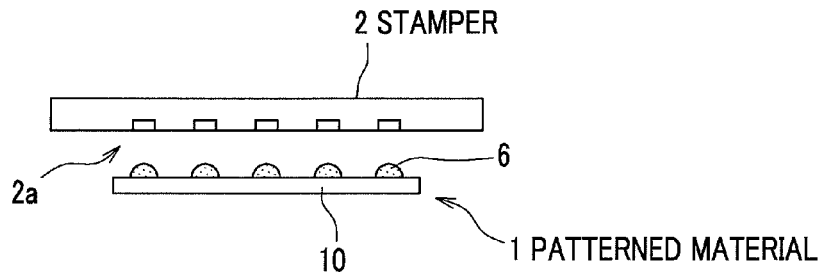
FIG.2B
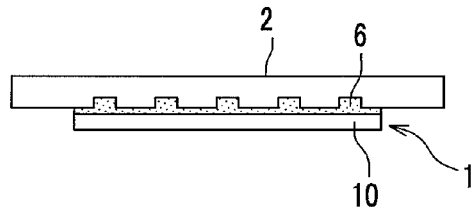
FIG.2C
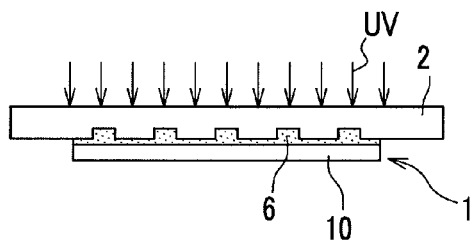
FIG.2D
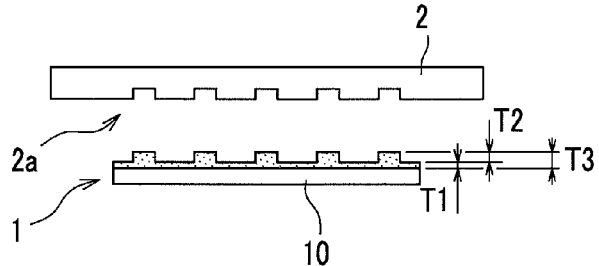

IMPRINT DEVICE AND MICROSTRUCTURE TRANSFER METHOD

CROSS-REFERENCE TO RELATED APPLICATION(S)

This application claims the foreign priority benefit under Title 35, United States Code, §119(a)-(d), of Japanese Patent Application No. 2006-187958 filed on Jul. 7, 2006 in the Japan Patent Office, the disclosure of which is herein incorporated by reference in its entirety.

BACKGROUND OF THE INVENTION

1. Field of the Invention

The present invention relates to an imprint device and a microstructure transfer method for transferring a fine-patterned structure of a stamper to a surface of a patterned material.

2. Description of the Related Art

Microfabrication of semiconductor integrated circuits has progressed and there has been improvement in the accuracy for forming a pattern of a semiconductor integrated circuit by, for example, the photolithography device in order to perform the microfabrication process. On the other hand, a pattern for the microfabrication process is almost as small as a wavelength of an exposure light source, and therefore the microfabrication process is approaching to a limit for the high accuracy of the pattern formation. Therefore, the electron beam lithography device, which is a type of the charged particle beam device, has been used instead of the photolithography device in order to obtain the higher accuracy of the pattern formation.

The pattern formation by the electron beam lithography device is different from a pattern formation by a batch exposure method using a light source such as i-line, an excimer laser or the like, and in the electron beam lithography device an exposure (drawing) time of patterns increases according to the increasing of the patterns to be drawn by the electron beam. Therefore, the time required for the pattern formation becomes longer as the integration of the semiconductor integrated circuit increases. As a result, a throughput becomes considerably lower.

For speeding up the pattern formation by the electron beam lithography device, there has been development in batch drawing radiation method, in which the electron beam is applied with various types of masks combined. However, the electron beam lithography device, which uses the batch drawing radiation method, increases in size and requires a mechanism for controlling a position of a mask with higher accuracy, thereby increasing the cost of the device.

Furthermore, there has been known as another technique for the pattern formation an imprint technique for transferring a surface structure of a predetermined stamper on a patterned material by pressing the stamper against the patterned material. In the imprint technique, the stamper has a fine-patterned portion (surface structure) corresponding to a fine-patterned portion of a pattern to be formed on the patterned material. The stamper is pressed against the patterned material, which is produced by forming a resin layer on a prescribed substrate. Thereby, a microstructure having a fine pattern width of less than or equal to 25 nm is transferred to and formed on the resin layer of the patterned material. The resin layer having the pattern transferred thereto (hereinafter referred to as a pattern formation layer) includes a thin film layer formed on a substrate and a pattern layer formed on the thin film layer and having projections. There has been consideration for applications of the imprint technique in the pattern formation for a record bit in a high-capacity recording medium or a semiconductor integrated circuit. For example, a substrate for a high-capacity recording medium or a semiconductor integrated circuit may be manufactured by etching an exposed portion of a thin film layer at a concave portion of the pattern formation layer, and a portion of a substrate in contact with the portion of the thin film layer with a convex portion of the pattern formation layer formed by the imprint technique as a mask. The accuracy for the etching process of the substrate is affected by a thickness distribution of the thin film layer in the surface direction. More specifically, for example, a thickness variation of the thin film layer in the surface direction is such that the difference in thickness between the thickest portion and the thinnest portion of the thin film layer is 50 nm. When the patterned material having such a thin film layer is etched in the depth of 50 nm, the substrate in contact with the thin portion of the thin film layer is etched while the substrate in contact with the thick portion of the thin film layer may not be etched. Therefore, the thickness of the thin film layer formed on the substrate needs to be uniform in order to maintain a predefined accuracy of the etching process. Namely, the thickness of the resin layer formed on the substrate needs to be uniform in the surface direction in order to form the thin film layer having the uniform thickness.

U.S. Pat. No. 6,696,220 discloses a conventional imprint device including a stamper having a flat surface on which a fine pattern is formed, and the flat surface of the stamper is mechanically pressed against the patterned material, thereby transferring the fine pattern to the patterned material. In the imprint device, the fine pattern is formed on the flat surface of the stamper, and therefore it is possible to apply a uniform pressure to a patterned region, to which the fine pattern of the stamper is transferred, of the patterned material. When the uniform pressure is applied to the patterned region, the resin layer having the uniform thickness is formed on the patterned material. That is, when the fine pattern is formed on the patterned material with the resin layer having the uniform thickness, the thickness of the pattern formation layer is uniform and thereby the thickness of the thin film layer of the pattern formation layer is uniform, too.

However, the above-described imprint device requires an adjustment mechanism capable of aligning the stamper and the patterned material parallel to each other with high accuracy, thereby making a configuration of the imprint device complicated. Furthermore, in the imprint device, there is a limit on the size of the stamper to be able to be made flat, and it is difficult to form the pattern formation layer (thin film layer) having the uniform thickness by pressing a larger size of the patterned region against the stamper at one time.

For example, Japanese Laid-open Patent Application Nos. 2003-157520 and 2005-52841 disclose an imprint device, in which a patterned material and a stamper are pressed against each other on a stage through an elastic material. United States Patent Publication No. 2003/189273 discloses an imprint device in which a liquid is sealed in a cavity provided on a back surface of a stamper or a patterned material. Furthermore, U.S. Pat. No. 6,482,742 discloses an imprint device in which a stamper and a patterned material are disposed within a vessel, the internal pressure of which is adjusted.

In the imprint devices of the above-described patent references, however, a pressure distribution between the surfaces of the stamper and the patterned material is uniform when the stamper and the patterned material are pressed against each other. Therefore, it is difficult to sufficiently spread the resin between the stamper and the patterned material when the patterned region is larger and the thin film layer is thinner. In this case, the stamper and the patterned material can be damaged when the stamper is pressed against the patterned material with a higher pressure to spread the resin between the stamper and the patterned material.

SUMMARY OF THE INVENTION

The present invention was made to solve the problems as described above, and it is an object of the present invention to provide an imprint device and a microstructure transfer method, by which it is possible to sufficiently spread a resin or other material for forming a pattern layer between a stamper and a patterned material with a lower pressure so as not to damage the stamper or the patterned material, and to form a pattern formation layer having the uniform thickness on the patterned material.

According to one aspect of the present invention, there is provided an imprint device for transferring a fine pattern to a material to form a patterned material. The device comprises a stamper having the fine pattern thereon, and a pressure distribution mechanism. The stamper is pressed against the material, and the pressure distribution mechanism provides a nonuniform pressure distribution in a patterned region of the patterned material, while the stamper is in contact with the material.

According to another aspect of the present invention, there is provided a microstructure transfer method comprising a step of contacting a stamper having a fine pattern thereon with a material, and a step of transferring the fine pattern of the stamper to the material by pressing the stamper against the material, so as to form a patterned material. In the step of transferring, a nonuniform pressure distribution is provided in a patterned region of the patterned material.

With the imprint device and the microstructure transfer method of the present invention, it is possible to sufficiently spread a resin or other material for forming a pattern layer between a stamper and a patterned material with a lower pressure so as not to damage the stamper or the patterned material, and to form a pattern formation layer having the uniform thickness on the patterned material.

BRIEF DESCRIPTION OF THE DRAWINGS

The object and features of the present invention will become more readily apparent from the following detailed description taken in conjunction with the accompanying drawings in which:

FIGS. 2A to 2D schematically illustrate a process of a microstructure transfer method according to an embodiment of the present invention;

FIG. 3A illustrates a configuration of an imprint device, and FIG. 3B schematically illustrates an arrangement of openings of flow paths provided in an imprint device;

DETAILED DESCRIPTION OF THE PREFERRED EMBODIMENT

Hereinafter, embodiments of the present invention will be described in detail with reference to the attached drawings.

First Embodiment

Figure 1:
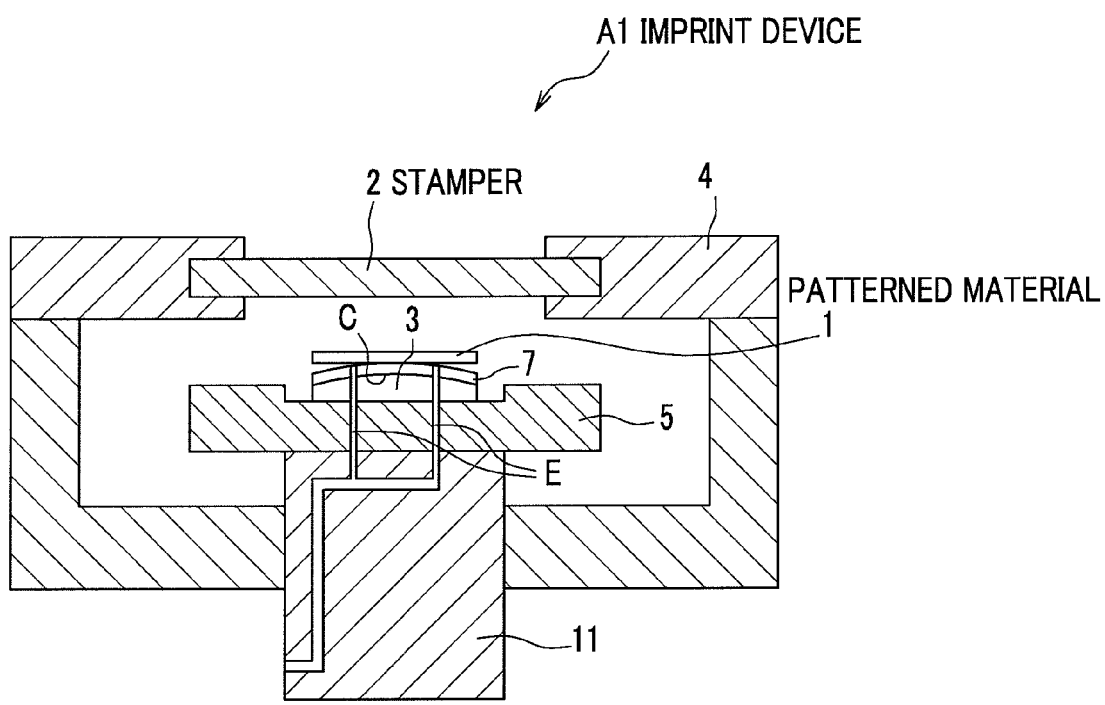
FIG. 1 illustrates a configuration of an imprint device according to a first embodiment of the present invention.

Detailed description will be provided for a first embodiment of the present invention with reference to the attached drawings. FIG. 1 illustrates a configuration of an imprint device according to the first embodiment.

As shown in FIG. 1, an imprint device A1 of the first embodiment includes an up-down mechanism 11, a stage 5 that is moved up and down by the up-down mechanism 11, a plate 3, and a buffer layer 7. The plate 3 and the buffer layer 7 are disposed on the stage 5 in order. The imprint device A1 includes air intake paths E connected to a suction unit (not shown) such as a pump. Each of the air intake paths E passes through the inside of the up-down mechanism 11, the stage 5, the plate 3, and the buffer layer 7, and has an opening at the upper surface of the buffer layer 7. An opening of the air intake path E on the opposite side of the buffer layer 7 is connected to the above-described suction unit. A patterned material 1 is disposed on the plate 3 through the buffer layer 7, and a stamper 2 is arranged above the patterned material 1. Photo curable resin 6 (see FIG. 2A), which will be described later, is applied to the surface of the patterned material 1 opposing the stamper 2. A fine pattern 2a (see FIG. 2A) having a fine-patterned structure is formed on the surface of the stamper 2 opposing the patterned material 1. As shown in FIG. 1, the stamper 2 is held by a stamper holding unit 4, and the patterned material 1 is pressed against the stamper 2 by moving up the stage 5 by the up-down mechanism 11. The stage 5 is disposed in a space of a pressure-reduced chamber, and it is possible to reduce the pressure in the pressure-reduced chamber by an exhaust unit (not shown) such as a vacuum pump. The above-described imprint device A1 is designed to transfer the fine pattern 2a of the stamper 2 to a surface of the patterned material 1 by pressing the stamper 2 against the patterned material 1, and to provide a nonuniform pressure distribution in a patterned region on the surface of the patterned material 1 having the fine pattern 2a is transferred.

It should be noted that the patterned material 1 denotes a material having the fine pattern 2a of the stamper 2 transferred thereto and also a material before the fine pattern 2a of a stamper 2 is transferred. In the following description, for convenience of explanation, the material before and after the fine pattern 2a of the stamper 2 is transferred to the material will be referred to as the patterned material 1.

The plate 3 may be made of glass, metal, resin, or the like. The plate 3 is harder and has a higher coefficient of elasticity than that of the buffer layer 7, which will be described below, and the plate 3 has the strength and the capacity to be provided with a desired curved surface. The plate 3 has a curved surface C on the upper side thereof, and is disposed on the stage 5 so that the highest portion of the curved surface C is positioned in the center. The curved surface C of the plate 3 may be a spherical surface having the constant curvature, or an aspheric (crooked) surface, that is, a curvature in a region, to which the fine pattern 2a of the stamper 2 is transferred (hereinafter referred to as a patterned region), is larger than a curvature in a region outside the patterned region. The plate 3 may have any appropriate surface structure to provide a required pressure distribution for forming a predetermined thin film layer T1 (see FIG. 2D), which will be described later. The highest portion of the plate 3 may not be positioned only in the center portion of the patterned region, but may be positioned, for example, in portions other than the center portion. The plate 3 may be configured such that the highest portion of the plate 3 is formed like peaks so as to define a ring-shaped closed region.

The buffer layer 7 is an elastic layer formed on the curved surface C of the plate 3. The buffer layer 7 is made of a material having a lower coefficient of elasticity than that of a material of the plate 3, the patterned material 1, or the stamper 2. The patterned material 1 and the stamper 2 will be described later in detail. The buffer layer 7 having such a lower coefficient of elasticity prevents a position of the patterned material 1 from being moved relative to the stamper 2 when the stamper 2 is pressed against the patterned material 1.

A material or a thickness of the buffer layer 7 may be appropriately determined to provide a required pressure distribution for forming the thin film layer T1 (see FIG. 2D), which will be described later. The buffer layer 7 may be made of resin such as polystyrene, polyamide, or polycarbonate, or silicone resin. The buffer layer 7 may include a material such as fluorine to enhance separation of a material from the buffer layer 7, or a layer including a material to enhance the separation may be formed on a surface of the buffer layer 7. The upper surface of the buffer layer 7 corresponds to the curved surface C of the plate 3.

The patterned material 1 is a disk-shaped member, and the fine pattern 2a formed on the stamper 2 is transferred to the patterned material 1. The patterned material 1 of the first embodiment includes a substrate 10 (see FIG. 2A) and the photo curable resin 6 (see FIG. 2A) applied to the substrate 10 so as to form a pattern formation layer T3 (see FIG. 2D) on the substrate 10, as described below. The substrate 10 and the pattern formation layer T3 will be later described in detail. The photo curable resin 6 may be a well-known resin material having a photosensitive material added thereto. The photo curable resin 6 may be a resin material including cyclo-olefin polymer, polymethyl methacrylate, polystyrene polycarbonate, polyethylene terephthalate (PET), polylactate, polypropylene, polyethylene, polyvinyl alcohol, or the like as a dominant component.

The photo curable resin 6 may be applied to the substrate 10 by the dispensing technique or the spin coating technique.

When using the dispensing technique, the photo curable resin 6 is dropped to the surface of the substrate 10. The dropped photo curable resin 6 spreads on the surface of the substrate 10 when the stamper 2 is pressed against the patterned material 1. When the photo curable resin 6 is dropped to a plurality of positions on the substrate 10, a distance between each of the centers of the positions may be made longer than the diameter of a drop of the photo curable resin 6.

In order to determine a position where the photo curable resin 6 is dropped, the spread of the photo curable resin 6 may be estimated depending on a fine pattern to be formed. Then, the position where the photo curable resin 6 is dropped is determined depending on the estimation. An amount of the photo curable resin 6 per drop onto the substrate 10 is adjusted to be at least the necessary amount to form the thin film layer T1 (see FIG. 2D) and a pattern layer T2 (see FIG. 2D) formed on the surface of the thin film layer T1, and a position of each drop of the photo curable resin 6 is adjusted at the same time. The thin film layer T1 and the pattern layer T2 will be described in detail later.

When using the spin coating technique, an amount of the photo curable resin 6 per drop onto the substrate 10 is adjusted to be at least the necessary amount to form the thin film layer T1 (see FIG. 2D) and a pattern layer T2 (see FIG. 2D) formed on the surface of the thin film layer T1. Also, a spin rotation speed and a viscosity of the photo curable resin 6 are adjusted at the same time.

An applicable material to the patterned material 1 used in the present invention, other than the photo curable resin 6, includes one having a thin film of resin other than the photo curable resin 6, such as thermosetting resin or thermoplastic resin, formed on the prescribed substrate 10, or one made of such a resin (including a resin sheet) alone. When using the thermoplastic resin, the patterned material 1 is prepared to have a temperature higher or equal to the glass transition temperature of the thermoplastic resin before the stamper 2 is pressed against the patterned material 1. When using the thermoplastic resin, the patterned material 1 and the stamper 2 are cooled off after the stamper 2 is pressed against the patterned material 1. When using the thermosetting resin, the patterned material 1 and the stamper 2 are left at a polymerization temperature after the stamper 2 is pressed against the patterned material 1, thereby curing the thermosetting resin. After the thermosetting resin or the thermoplastic resin becomes cured, the patterned material 1 and the stamper 2 are separated from each other, whereby the fine pattern 2a of the stamper 2 is transferred to the patterned material 1.

A material of the above-described substrate 10 may be chosen from various types of materials, such as silicon, glass, aluminum alloy, or resin. The substrate 10 may have a multilayer structure where a metal layer, a resin layer, an oxide film layer or the like is formed on the surface of the substrate 10.

An outline of the patterned material 1 may be a circle, an ellipse, or a polygon according to an application thereof, and the patterned material 1 may be provided with a center through hole.

As described above, the stamper 2 has the fine pattern 2a to be transferred to the patterned material 1. A fine-patterned portion of the fine pattern 2a is formed on the surface of the stamper 2 by, for example, the photolithography technique, the focused ion beam lithography, the electron-beam printing technique, the plating technique, or the like. An appropriate technique to form the fine pattern 2a on the stamper 2 may be determined depending on an accuracy of processing of the fine pattern 2a to be formed. In the first embodiment, the stamper 2 is made of a transparent material because the photo curable resin 6 applied to the patterned material 1 is irradiated with an electromagnetic ray such as an ultraviolet light through the stamper 2. However, the present invention is not limited to this, and the stamper 2 may also be an opaque material when other material such as thermosetting resin or thermoplastic resin is used instead of the photo curable resin 6.

A material of the stamper 2 may be silicon, glass, nickel, resin, or the like. An outline of the stamper 2 may be a circle, an ellipse, or a polygon depending on a technique of pressing the stamper 2. The stamper 2 may be provided with a center through-hole. Furthermore, a fluorine-based or silicone-based release agent may be applied to the surface of the stamper 2 in order to smoothly separate the photo curable resin 6 and the stamper 2. The stamper 2 may have different shape and surface area from the patterned material 1 as long as the fine pattern 2a is transferred to a predetermined region of the patterned material 1.

With reference to the attached drawings, description will be provided for an operation of the imprint device A1 and a microstructure transfer method according to the first embodiment. Of the drawings to be referred to, FIGS. 2A to 2D schematically illustrate a process of a microstructure transfer method according to an embodiment of the present invention, and mainly illustrate positional relations between the stamper 2 and the patterned material 1.

In the imprint device A1 shown in FIG. 1, the patterned material 1 is arranged on the plate 3 through the buffer layer 7. Specifically, the patterned material 1 is disposed on the curved upper surface of the buffer layer 7 having the highest portion of the curved surface in the center. The patterned material 1 is vacuumed onto the upper surface of the buffer layer 7 through the openings of the air intake paths E so that the patterned material 1 is supported on the buffer layer 7. Then, as described above, the air is discharged from the pressure-reduced chamber, and thereby the patterned material 1 is exposed to a pressure-reduced atmosphere in the pressure-reduced chamber.

When the stage 5 is then moved up by the up-down mechanism 11 shown in FIG. 1, the stamper 2 is pressed against the patterned material 1. Accordingly, as shown in FIG. 2B, the photo curable resin 6 applied to the patterned material 1 contacts the fine pattern 2a (see FIG. 2A) of the stamper 2. Because the lower surface of the patterned material 1 is in contact with the buffer layer 7 having the highest portion in the center, the upper surface of the patterned material 1 is pressed against the stamper 2 with the highest pressure at the center portion of the patterned material 1. As the stage 5 is further moved up, the pressure applied to the patterned material 1 increases, so that the pressure distribution on the patterned material 1 changes over time.

Because the buffer layer 7 has the curved surface, the pressure applied to the patterned material 1 gradually becomes lower from the center portion toward the circumference portion thereof. That is, the pressure distribution on the patterned material 1 is nonuniform. As the stage 5 is further moved up, the pressure distribution on the patterned material 1 changes over time from the center portion toward the circumference portion thereof. The elastic buffer layer 7 is more greatly deformed in the center portion thereof, and is less deformed toward the outer circumference of the patterned material 1. As a result, the pressure applied to the patterned material 1 becomes highest in the center portion thereof, gradually becomes lower toward the circumference portion, and becomes lowest at the outermost circumference thereof. Namely, a contour line of the pressure distribution is defined in a concentric pattern on the patterned material 1. As described above, the photo curable resin 6 applied to the patterned material 1 spreads between the stamper 2 and the patterned material 1 when the stamper 2 is pressed against the patterned material 1.

Preferably, an alignment mechanism (not shown) is provided to align the stamper 2 with the patterned material 1 when the stamper 2 contacts the patterned material 1. An alignment technique may be a mechanical technique, by which the patterned material 1 and the stamper 2 are physically placed on a base component, or an optical technique, by which a predetermined reference point provided on each of the patterned material 1 and the stamper 2 is optically detected. An appropriate alignment technique may be chosen depending on a shape of the concerned patterned material 1 or a required accuracy of the alignment, or the like. The alignment of the stamper 2 and the patterned material 1 is carried out before the photo curable resin 6 becomes cured and may be carried out before or after the patterned material 1 contacts the stamper 2.

As shown in FIG. 2C, the photo curable resin 6 is irradiated with an ultraviolet light UV from a light source (not shown) through the stamper 2 so that the photo curable resin 6 becomes cured. When the stage 5 is moved down by the up-down mechanism 11 shown in FIG. 1, the patterned material 1, which is vacuumed onto the upper surface of the buffer layer 7 through the openings of the air intake paths E, is separated from the stamper 2. Accordingly, as shown in FIG. 2D, the patterned material 1 separated from the stamper 2 has the fine pattern 2a of the stamper 2 transferred thereto. Therefore, the patterned material 1 has the pattern formation layer T3 formed on the substrate 10. The pattern formation layer T3 includes the thin film layer T1 as a base layer and the pattern layer T2 formed on the thin film layer T1 and having projections.

According to the imprint device A1 and the microstructure transfer method as described above, the pressure distribution provided between the stamper 2 and the patterned material 1 is nonuniform, unlike the conventional imprint device or the conventional transfer method as disclosed in, for example, the above-described patent references. According to the imprint device A1 and the microstructure transfer method, it is possible to spread the photo curable resin 6 between the stamper 2 and the patterned material 1 with a low pressure so as not to damage the stamper 2 or the patterned material 1, even when it is aimed to enlarge a patterned region or reduce the thin film layer T1 in the thickness. It is also possible to form the pattern formation layer T3 having a uniform thickness on the patterned material 1.

Second Embodiment

Figure 3A:
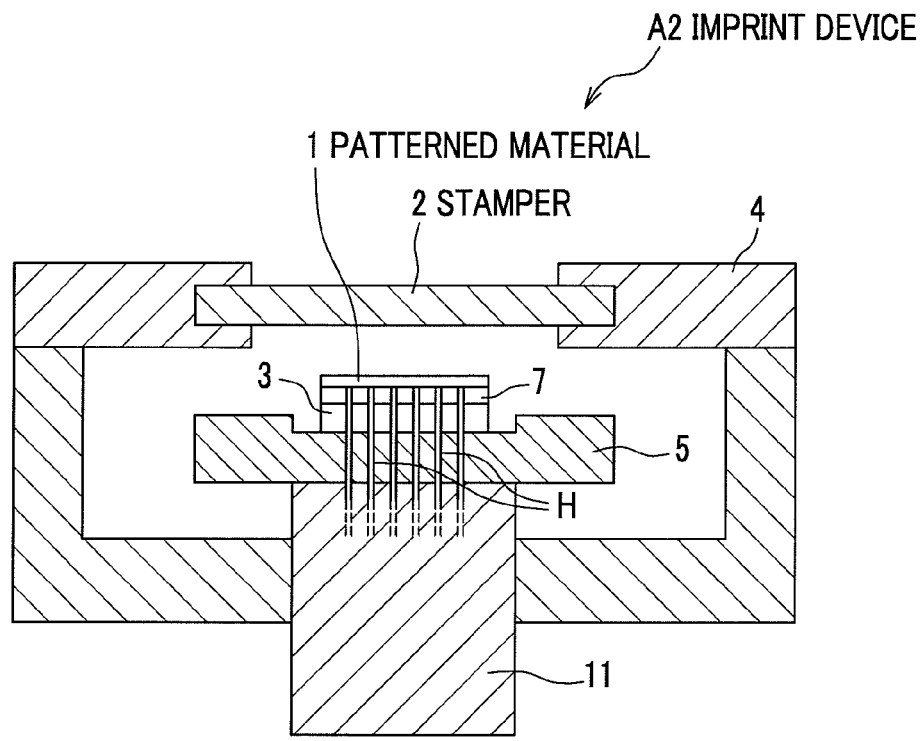
FIGS. 3A and 3B illustrate an imprint device according to a second embodiment of the present invention.
Figure 3B:
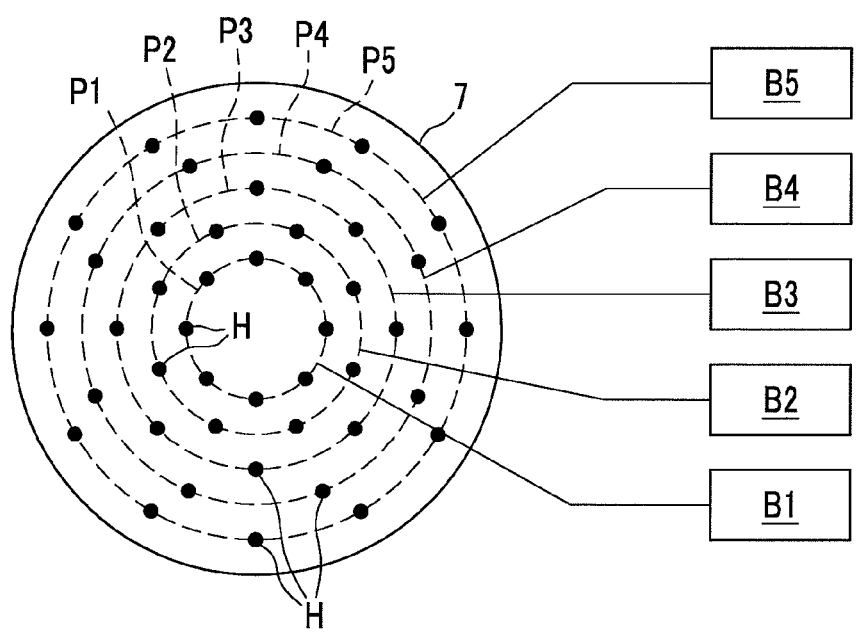

Next, detailed description will be provided for a second embodiment of the present invention with reference to the attached drawings. Of the drawings to be referred to, FIGS. 3A and 3B illustrate an imprint device according to the second embodiment. FIG. 3A illustrates a configuration of an imprint device, and FIG. 3B schematically illustrates an arrangement of openings of flow paths provided in an imprint device. In the imprint device according to the second embodiment, a configuration of a plate arranged on a stage is different from that of the plate according to the first embodiment, and therefore description will be mainly provided for the configuration of the plate of the second embodiment.

In an imprint device A2 of the second embodiment, as shown in FIG. 3A, a plate 3 has the flat upper surface on the side to face the stamper 2. A buffer layer 7 is disposed on the flat upper surface of the plate 3, and the buffer layer 7 also has a flat upper surface. The imprint device A2 includes a plurality of flow paths H, through which pressurized fluid flows. Each of the plurality of flow paths H passes through the inside of an up-down mechanism 11, a stage 5, the plate 3, and the buffer layer 7, and has an opening at the upper surface of the buffer layer 7.

As shown in FIG. 3B, the openings of the flow paths H are arranged in five concentric circles on the upper surface of the buffer layer 7. The flow paths H, the openings of which are arranged in the same circle, are connected to the same pipe, respectively. More specifically, the flow paths H, the openings of which are arranged in the innermost circle on the upper surface of the buffer layer 7, are connected to a ring-shaped pipe P1, as shown in FIG. 3B. Furthermore, the other flow paths H arranged in other outer circles, from the inside toward the outside of the upper surface of the buffer layer 7, are connected to ring-shaped pipes P2, P3, P4, and P5 in series. Although not shown, the pipes P1, P2, P3, P4, and P5 are disposed inside the up-down mechanism 11 (see FIG. 3A). As shown in FIG. 3B, the pipes P1, P2, P3, P4, and P5 are connected to pressure adjustment mechanisms B1, B2, B3, B4, and B5, respectively, which adjust the pressure of fluid flowing through each of the pipes P1, P2, P3, P4, and P5. The pressure adjustment mechanisms B1, B2, B3, B4, and B5 adjust the pressure of fluid flowing through each of the pipes P1, P2, P3, P4, and P5, so that the fluid is ejected from the openings of the flow paths H arranged in the same circle with the same pressure. The pressure with which the fluid is ejected from the openings may not necessarily be the same, and may be adjusted to a different pressure if required.

Next, description will be provided for an operation of the imprint device A2 and a microstructure transfer method according to the second embodiment.

In the above-described imprint device A2, the stage 5 is moved up by the up-down mechanism 11 shown in FIG. 3A, and the fluid is ejected from each of the openings of the flow paths H provided on the buffer layer 7. Thereby, the lower surface of the patterned material 1 is separated from the upper surface of the buffer layer 7 and then the upper surface of the patterned material 1 contacts the stamper 2. The fluid is ejected from the openings of the flow paths H connected to the pipe P1 arranged on the innermost side, and then the fluid is ejected from the openings of the flow paths H connected to the pipes P2, P3, P4, and P5 in series. Thereby, the pressure distribution on the patterned material 1 changes over time from the center portion toward the outer circumferential portion thereof. Furthermore, the pressure of the fluid flowing through each of the pipes P1, P2, P3, P4, and P5 is adjusted such that the pressure of the fluid through the pipe P1 is highest and the pressure of the fluid through each of the pipes P2, P3, P4, and P5 gradually becomes lower, so that the center portion of the upper surface of the patterned material 1 is pressed against the stamper 2 with the highest pressure, and the pressure applied to the patterned material 1 gradually becomes lower from the center portion of the patterned material 1 toward the circumferential portion thereof. The elastic buffer layer 7 is more greatly deformed in the center portion thereof, and is less deformed toward the outer circumference of the patterned material 1. As a result, the pressure applied to the patterned material 1 is highest in the center portion thereof, gradually becomes lower toward the circumference portion, and is lowest at the outermost circumference thereof. More specifically, a contour line of the pressure distribution is defined in a concentric pattern on the patterned material 1. The photo curable resin 6 applied to the patterned material 1 spreads between the stamper 2 and the patterned material 1 when the stamper 2 is pressed against the patterned material 1 as described above. The fluids may be ejected through the pipes P1, P2, P3, P4, and P5 simultaneously without changing the timing for ejecting the fluid through each of the pipes P1, P2, P3, P4, and P5, as described above. In this case, it is preferable to change the pressure of the fluid through each of the pipes P1, P2, P3, P4, and P5 so as to provide the pressure distribution on the patterned material 1.

Then, after the photo curable resin 6 becomes cured in the same manner as that of the first embodiment, the pressure of the fluid through each of the pipes P1, P2, P3, P4, and P5 is reduced by the pressure adjustment mechanisms B1, B2, B3, B4, and B5 so that the patterned material 1 sticks to the upper surface of the buffer layer 7. Next, the stage 5 is moved down by the up-down mechanism 11 shown in FIG. 3A, and thereby the patterned material 1 is separated from the stamper 2. Accordingly, the separated patterned material 1 has the pattern formation layer T3 formed on the substrate 10 and having the fine pattern 2b (see FIG. 2D) of the stamper 2 transferred thereto.

According to the imprint device A2 and the microstructure transfer method as described above, the pressure distribution provided between the stamper 2 and the patterned material 1 is nonuniform, unlike the conventional imprint devices and the transfer methods as disclosed in, for example, the above-described patent references. According to the imprint device A2 and the microstructure transfer method, it is possible to spread the photo curable resin 6 between the stamper 2 and the patterned material 1 with a low pressure so as not to damage the stamper 2 or the patterned material 1, even when a patterned region is enlarged and the thin film layer T1 is reduced in the thickness. It is also possible to form the pattern formation layer T3 having the uniform thickness on the patterned material 1.

The present invention is not limited the configurations of the above-described embodiments, and may have other various configurations.

According to the above embodiments, the fine pattern 2a is transferred to one side of the patterned material 1. However, the fine pattern 2a may be transferred to both sides of the patterned material 1. In this case, a pair of stampers 2, 2 is arranged to sandwich the patterned material 1.

According to the above-mentioned first embodiment, the stamper 2 is pressed against the patterned material 1 in a pressure-reduced atmosphere. In the present invention, however, the stamper 2 may be pressed against the patterned material 1 in atmospheric pressure.

In the above embodiments, after the stamper 2 is arranged above the plate 3, the patterned material 1 having the photo curable resin 6 applied thereto is arranged to face the stamper 2. However, an imprint device according to the present invention may be configured such that the patterned material 1 having the photo curable resin 6 applied thereto is arranged on the plate 3 and then the stamper 2 is arranged to face the patterned material 1. Furthermore, the stamper 2 having the photo curable resin 6 applied thereto may be arranged relative to the patterned material 1 in the same manner as described above. The imprint devices A1, A2 according to the above-described embodiments may be configured such that a unit for applying the photo curable resin 6, such as a dispenser or an inkjet head, is mounted in the devices A1, A2 so that the photo curable resin 6 is automatically applied to the patterned material 1 or the stamper 2.

Figure 4:
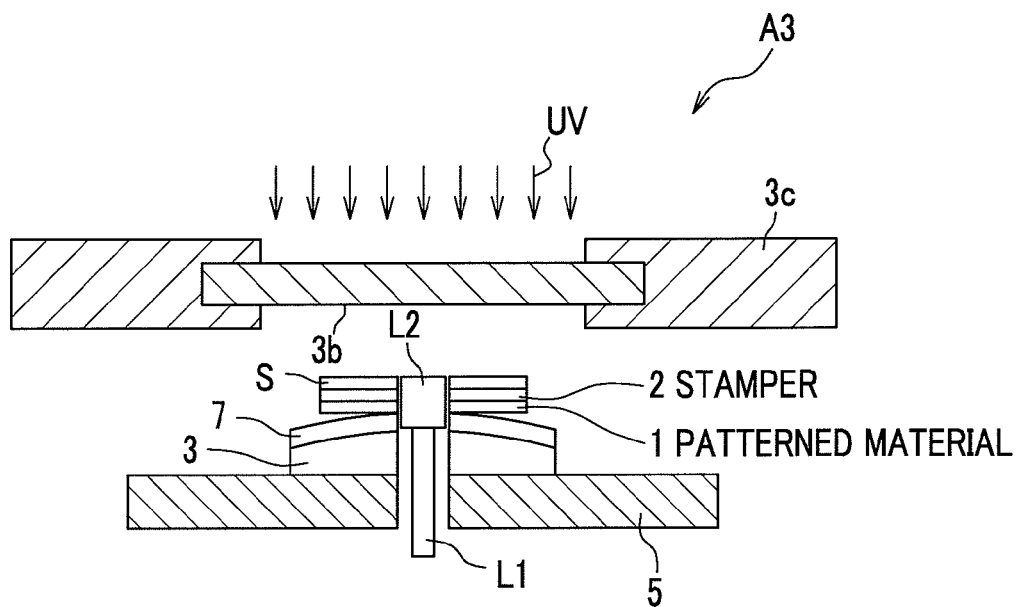
FIG. 4 illustrates a configuration of an imprint device used in a first example of the present invention.

In the first embodiment of the present invention, the patterned material 1 is pressed against the stamper 2 held by the stamper holding unit 4 by moving up the stage 5. In the present invention, however, the stamper 2 may be arranged between the patterned material 1 and an upper plate 3b held by a plate holding unit 3c, as shown in FIG. 4, so that the patterned material 1 is pressed against the stamper 2 by moving up the stage 5. On a surface of the upper plate 3b opposing the stamper 2 may be arranged a buffer layer 7 similar to the buffer layer 7 arranged on the surface of the plate 3. The upper plate 3b may be provided with a curved surface C on the side to face the patterned material 1 in the same manner as the curved surface C of the plate 3. The imprint device shown in FIG. 4 will be described in a first example in detail later.

In the second embodiment of the present invention, the plurality of flow paths H is provided in the plate 3. In an imprint device including the above-described upper plate 3b (see FIG. 4), a plurality of flow paths H may be provided in the upper plate 3b. More specifically, when the upper plate 3b is pressed against the stamper 2, a fluid ejects through each of the flow path H provided in the upper plate 3b, so that a contour line of the pressure distribution is defined in a concentric pattern on the stamper 2 from the center portion toward the circumference portion thereof, in the same manner as the patterned material 1 in the second embodiment.

The patterned material 1 having the fine pattern 2a transferred thereto according to the first and second embodiments may be applied to an information recording medium such as a magnetic recording medium or an optical recording medium. Furthermore, the patterned material 1 may be applied to a component for a large-scale integrated circuit, an optical component such as a lens, a polarization plate, a wavelength filter, a light emitting device, or an optical integrated circuit, or a bio-device for immune assay, DNA separation, cell culture, or the like.

EXAMPLE

Next, the present invention will be described in more detail by illustrating examples of the present invention.

First Example

In a first example, description will be provided for a microstructure transfer method of transferring a fine pattern of a stamper 2 to a patterned material 1 by using an imprint device A3 shown in FIG. 4. FIG. 4 illustrates a configuration of an imprint device used in the first example.

In the imprint device A3 shown in FIG. 4, a plate 3 having a curved surface on one side was arranged on a stage 5, which was made of stainless steel and was configured to move up and down. The plate 3 was made of quartz. The plate 3 was 30 mm in diameter, 10 mm in thickness at maximum, and had a spherical surface having the curvature radius of 2595 mm. A silicone rubber layer having the thickness of 0.5 mm was disposed on the surface of the plate 3 so as to form a buffer layer 7 on the plate 3. On the buffer layer 7 were disposed a patterned material 1, stamper 2, and a spacer S in this order. The patterned material 1 and the stamper 2 were arranged such that a resin-applied surface of the patterned material 1 and a pattern-formed surface of the stamper 2 were faced to each other. An upper plate 3b was held by a plate holding unit 3c above the spacer S. The upper plate 3b was made of quartz.

A pin L1 was inserted through central through-holes of the stage 5 and the plate 3 so as to align the axes of the central through-holes of the patterned material 1 and the stamper 2. Although not shown in FIG. 4, a pin tip L2 changed its diameter when the pin L1 was pressed toward the pin tip L2. The diameter of the pin tip L2 became large only when aligning the axes of the central through-holes of the patterned material 1 and the stamper 2, and the diameter of the pin tip L2 became small when disposing and pressing the patterned material 1 and the stamper 2.

In the first example, a glass substrate having the diameter of 27.4 mm, the thickness of 0.381 mm, and the central through-hole diameter of 7 mm was used as the patterned material 1.

A quartz substrate having the diameter of 27.4 mm, the thickness of 0.381 mm, and the central through-hole diameter of 7 mm was used as the stamper 2. Groove patterns each having the width of 2 µm, the pitch of 4 µm, and the depth of 80 nm were formed in the range of diameter from 20 to 25 mm of the stamper 2 in a concentric pattern by the photolithography technique. The groove patterns were arranged concentrically relative to the central axis of the central through-hole of the stamper 2. A releasing layer containing fluorine was formed on the surface of the stamper 2.

A resin was dropped to the surface of the patterned material 1 by the dispensing technique. The resin used in the first example was an acrylate-based resin having a photosensitive material added thereto, and prepared to have the viscosity of 4 cP (4 mPas). The resin was applied to the surface of the patterned material 1 by a dripping device (not shown) with a single nozzle. The resin was set to be applied in a drop of 8 nL.

The resin was applied to the surface of the patterned material 1 on the circumference at the radius of 10 mm thereof in four directions (90-degree interval).

Before the patterned material 1 and the stamper 2 were pressed against each other, the pressure in the pressure-reduced chamber was reduced to −80 kPa, and then stamper 2 was pressed against the patterned material 1 in the pressure atmosphere of −80 kPa. Thereby, the resin applied to the surface of the patterned material 1 spread on the patterned material 1 by the weight of the stamper 2, but the resin applied at each point in the four directions were not in contact with one another.

The stage 5 was moved up toward the upper plate 3b, and then the patterned material 1 and the stamper 2 were pressed against each other. The pressure load was set to be 0.25 kN. Because the lower surface of the patterned material 1 was in contact with the curved upper surface of the buffer layer 7 having the highest portion of the curved surface in the center, the center portion of the upper surface of the patterned material 1 was pressed against the stamper 2 with the highest pressure. As the stage 5 was further moved up, the pressure applied to the patterned material 1 increased, and then the pressure distribution on the patterned material 1 changed over time. When the pressure load reached 0.25 kN, the pressure load was highest in the vicinity of the circumference at the radius of 8 mm of the patterned material 1, and gradually becomes lower from an edge of the central through-hole toward the outer circumference of the patterned material 1, so that a contour line of the pressure distribution was defined in a concentric pattern on the patterned material 1. When the stamper 2 was pressed against the patterned material 1, the resin applied to the surface of the patterned material 1 was irradiated with an ultraviolet light UV from a light source (not shown) arranged above the upper plate 3b. The resin was irradiated with the ultraviolet light UV through the stamper 2 so that the resin became cured. After the resin became cured, the stage 5 was moved down. The patterned material 1 and the stamper 2 were transferred to a separation mechanism (not shown), and then the stamper 2 was separated from the patterned material 1. Accordingly, the thin film layer T1 (see FIG. 2D) was formed on the surface of the patterned material 1, and the pattern layer T2 (see FIG. 2D) including the groove patterns each having the width of 2 µm, the pitch of 4 µm, and the depth of 80 nm according to the fine pattern 2a (see FIG. 2D) formed on the surface of the stamper 2 was formed on the thin film layer T1 in a concentric pattern.

In the first example, the thin film layer T1 formed as described above was measured for the film thickness distribution. Portions of the surface of the patterned material 1 were removed in the radius direction at a 120-degree interval, and then a difference in level between the surface of the patterned material 1 and the surface of the thin film layer T1 was observed in the three directions on the surface of the patterned material 1 by the atom force microscope. In the range of radius from 10 to 12.5 mm of the patterned material 1, the average thickness of the thin film layer T1 was 1.9 nm and the standard deviation ($\sigma$) of the film thickness was 1.3 nm. The thickness of the thin film layer T1 ranges from 1 to 5 nm in the range of radius from 7 to 11 mm of the patterned material 1.

Second Example

The second example employs the plate 3 arranged in the imprint device A3 (see FIG. 4) in the first example and having a curved surface on one side, and in the second example the plate 3 had a spherical surface having the curvature radius of 5190 mm. In the same manner as the first example, the thin film layer T1 (see FIG. 2D) was formed on the surface of the patterned material 1, and the pattern layer T2 (see FIG. 2D) including the groove patterns each having the width of 2 μm, the pitch of 4 μm, and the depth of 80 nm according to the fine pattern 2a (see FIG. 2D) formed on the surface of the stamper 2 was formed on the thin film layer T1 in a concentric pattern. In the range of radius from 10 to 12.5 mm of the patterned material 1, the average thickness of the thin film layer T1 was 1.9 nm, and the standard deviation ($\sigma$) of the film thickness was 1.6 nm.

Comparative Example

In a comparative example, the following observation was made of a conventional imprint device that used a plate having flat surfaces on both sides thereof, instead of the plate 3 arranged in the imprint device A3 (see FIG. 4) in the first example and having a curved surface on one side. In the same manner as the first example, the thin film layer T1 (see FIG. 2D) was formed on the surface of the patterned material 1, and the pattern layer T2 (see FIG. 2D) including the groove patterns each having the width of 2 μm, the pitch of 4 μm, and the depth of 80 nm according to the fine pattern 2a (see FIG. 2D) formed on the surface of the stamper 2 was formed on the thin film layer T1 in a concentric pattern. The pressure load was set to be 0.5 kN, 1 kN, and 1.5 kN. In the range of radius from 10 to 12.5 mm of the patterned material 1, the average thickness of the thin film layer T1 and the standard deviation ($\sigma$) of the film thickness were determined for each of the above pressure loads. Table 1 shows the result of the observation.

TABLE 1

| Pressure load (kN) | 0.5 | 1 | 1.5 |
| --- | --- | --- | --- |
| The average thickness of the thin film layer (nm) | 50.6 | 9.3 | 9.5 |
| The standard deviation of the thickness of the thin film layer (nm) | 107 | 17 | 17 |

When comparing the average thickness of the thin film layer T1 and the standard deviation of the film thickness in the first and second examples with those in the comparative example, it was found that the average thickness and the standard deviation of the thin film layer T1 in the first and second examples were lower than that in the comparative example, although the applied pressure load in the first and second examples was lower that that in the comparative example. Therefore, it was proved that it is possible to spread the resin on the surface of the patterned material 1 with a lower pressure load than that of the conventional technique, and form the thin film layer T1 having the uniform thickness.

Third Example

Figure 5:
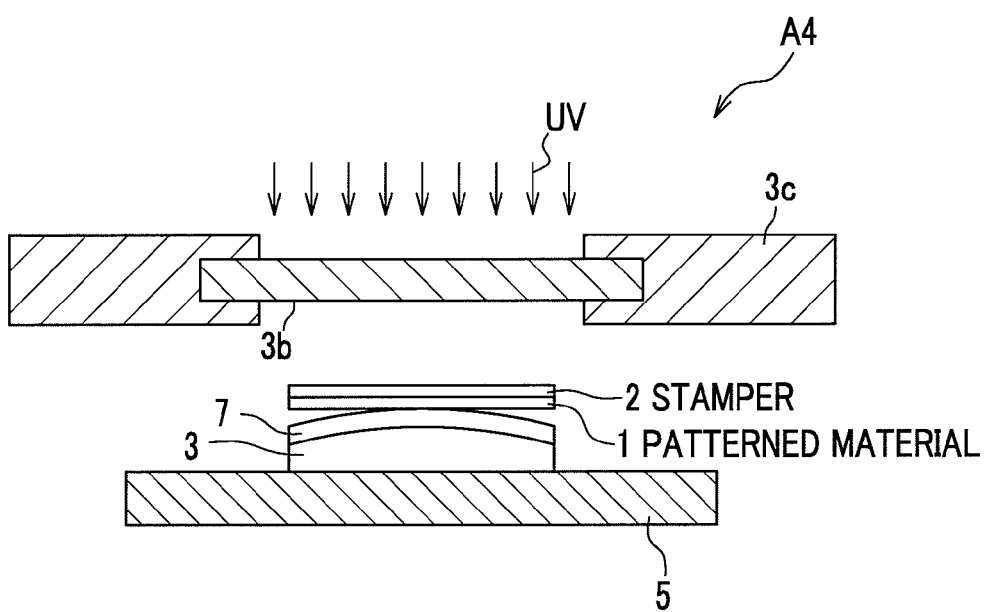
FIG. 5 illustrates a configuration of an imprint device used in a third example of the present invention.

In a third example, description will be provided for a microstructure transfer method of transferring a fine pattern 2a of a stamper 2 to a patterned material 1 by using an imprint device A4 shown in FIG. 5. FIG. 5 illustrates a configuration of an imprint device used in the third example.

In the imprint device A4, as shown in FIG. 5, a plate 3 having a curved surface on one side was arranged on a stage 5, which was made of stainless steel and was configured to move up and down. The plate 3 was made of quartz. The plate 3 was 100 mm in diameter, 20 mm in thickness at maximum, and had a spherical surface having the curvature radius of 5190 mm. A silicone rubber layer having the thickness of 0.5 mm was disposed on the surface of the plate 3 so as to form a buffer layer 7 on the plate 3. On the buffer layer 7 were disposed a patterned material 1 and a stamper 2 in this order. The patterned material 1 and the stamper 2 were arranged such that a resin-applied surface of the patterned material 1 and a pattern-formed surface of the stamper 2 face to each other. An upper plate 3b was arranged above the stamper 2 and held by a plate holding unit 3c. The upper plate 3b was made of glass.

In the third example, a quartz substrate having the diameter of 100 mm and the thickness of 1 mm was used as the patterned material 1.

A quartz substrate having the diameter of 100 mm and the thickness of 0.5 mm was used as the stamper 2. Groove patterns each having the width of 2 μm, the pitch of 4 μm, and the depth of 150 nm were formed in the range of diameter 80 mm of the stamper 2 in a concentric pattern by the photolithography technique. A releasing layer (not shown) containing fluorine was formed on the surface of the stamper 2.

A resin was dropped to the surface of the patterned material 1 by the dispensing technique. The resin had a photosensitive material added thereto, and was prepared to have the viscosity of 4 cP (4 mPas). The resin was applied to the surface of the patterned material 1 by a dripping device (not shown) with a single nozzle. The resin was applied in one drop of 2 μL in the center of the patterned material 1.

Before the patterned material 1 and the stamper 2 were pressed against each other, the pressure in the pressure-reduced chamber was reduced to −80 kPa, and the surfaces of the patterned material 1 and the stamper 2 were exposed to the lower pressure than the atmospheric pressure.

Next, the stage 5 was moved up toward the upper plate 3b, and then the patterned material 1 and the stamper 2 were pressed against each other. Because the lower surface of the patterned material 1 was in contact with the curved upper surface of the buffer layer 7, having the highest portion of the curved surface in the center, the center portion of the upper surface of the patterned material 1 was pressed against the stamper 2 with the highest pressure. As the stage 5 was further moved up, the pressure applied to the patterned material 1 increased, and then the pressure distribution on the patterned material 1 changed over time. When the stage 5 stopped moving up, the pressure load was highest in the center of the patterned material 1, and gradually becomes lower toward the outer circumference of the patterned material 1, so that a contour line of the pressure distribution was defined in a concentric pattern on the patterned material 1. While the stamper 2 was pressed against the patterned material 1, the resin applied to the surface of the patterned material 1 was irradiated with an ultraviolet light UV from a light source (not shown) arranged above the upper plate 3b. The resin was irradiated with the ultraviolet light UV through the stamper 2 so that the resin became cured. After the resin became cured, the stage 5 was moved down. Then, the patterned material 1 and the stamper 2 were transferred to a separation mechanism (not shown), and thereby the stamper 2 was separated from the patterned material 1. The thin film layer T1 (see FIG. 2D) was formed on the surface of the patterned material 1, and the pattern layer T2 (see FIG. 2D) including the groove patterns each having the width of 2 μm, the pitch of 4 μm, and the depth of 150 nm according to the fine pattern 2a (see FIG. 2D) formed on the surface of the stamper 2 was formed on the thin film layer T1 in a concentric pattern.

Portions of the surface of the patterned material 1 including the thin film layer T1 was removed in the diameter direction, so that a difference in level between the surface of the patterned material 1 and the surface of the thin film layer T1 was measured in the patterned region by the atom force microscope. The average thickness of the thin film layer T1 was 10.3 nm and the standard deviation (σ) of the film thickness was 9.9 nm.

Fourth Example

Figure 6:
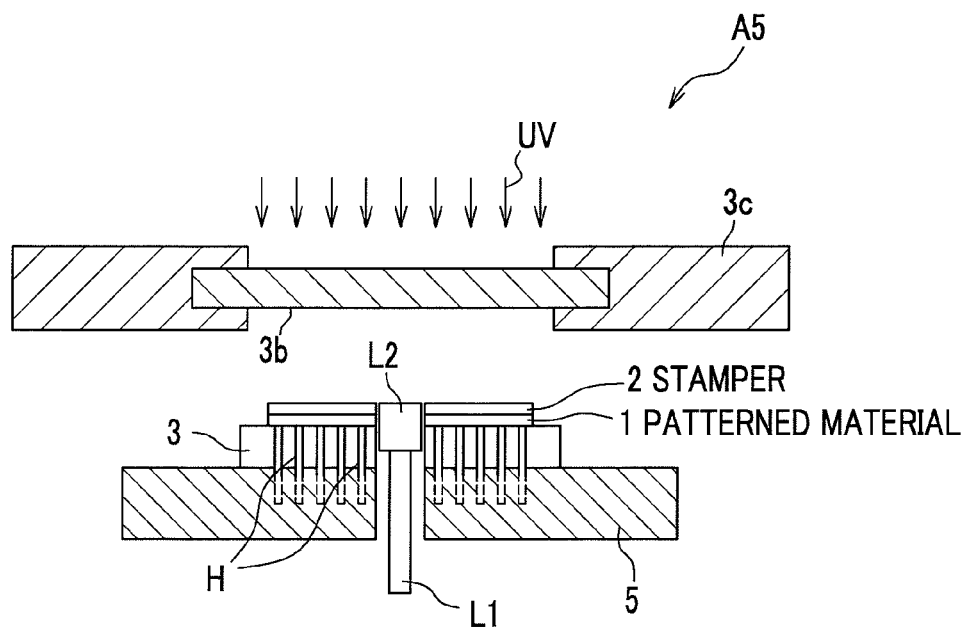
FIG. 6 illustrates a configuration of an imprint device used in a fourth example of the present invention.

In a fourth example, description will be provided for a microstructure transfer method of transferring a fine pattern 2a of a stamper 2 to a patterned material 1 by using an imprint device A5 shown in FIG. 6. FIG. 6 illustrates a configuration of an imprint device used in the fourth example.

In the imprint device A5, as shown in FIG. 6, a plate 3 has flat surfaces, and openings of a plurality of flow paths H are arranged in five concentric circles on the upper surface of the plate 3 in the same manner as shown in FIG. 3B. The plurality of flow paths H in each circle is connected to pressure adjustment mechanisms B1, B2, B3, B4, and B5, respectively, which operate individually, in the same manner as shown in FIG. 3B. The pressure adjustment mechanisms B1, B2, B3, B4, and B5 adjust the pressure of the nitrogen gas, so that the nitrogen gas is ejected from the openings of the flow paths H arranged in the same circle with the same pressure. A pin L1 was inserted through the center of the stage 5 so as to align the axes of the central through-holes of the patterned material 1 and the stamper 2. Although not shown, a pin tip L2 changes its diameter when the pin L1 is pressed toward the pin tip L2. The diameter of the pin tip L2 becomes large only when aligning the axes of the central through-holes of the patterned material 1 and the stamper 2, and the diameter of the pin tip L2 becomes small when disposing and pressing the patterned material 1 and the stamper 2.

In the fourth example, the patterned material 1 was disposed on the plate 3. The stamper 2 having the fine pattern 2a was disposed on the patterned material 1 to face a patterned surface of the patterned material 1. An upper plate 3b was held by a plate holding unit 3c. Before the patterned material 1 and the stamper 2 were pressed against each other, the pressure in the pressure-reduced chamber was reduced to −80 kPa, and the surfaces of the patterned material 1 and the stamper 2 were exposed to the lower pressure than the atmospheric pressure.

In the fourth example, a glass substrate having the diameter of 27.4 mm, the thickness of 0.381 mm, and the central through-hole diameter of 7 mm was used as the patterned material 1.

A quartz substrate having the diameter of 27.4 mm, the thickness of 0.381 mm, and the central through-hole diameter of 7 mm was used as the stamper 2. Groove patterns each having the width of 2 μm, the pitch of 4 μm, and the depth of 80 nm were formed in the range of diameter from 20 to 25 mm of the stamper 2 in a concentric pattern by the photolithography technique. The groove patterns were arranged concentrically relative to the central axis of the central through-hole of the stamper 2. A releasing layer containing fluorine was formed on the surface of the stamper 2.

A resin was dropped to the surface of the patterned material 1 by the dispensing technique. The applied resin was an acrylate-based resin having a photosensitive material added thereto, and prepared to have the viscosity of 4 cP (4 mPas). The resin was applied to the surface of the patterned material 1 by a coating head, which had 512 nozzles (2 rows each containing 256 nozzles) and ejected the resin by the piezo technique. The nozzles of the coating head were spaced at an interval of 70 μm in the row direction and 140 μm between the rows. Each of the nozzles ejected the resin of approximately 5 pL.

The positions on the patterned material 1, to which the resin is applied, were determined depending on the spread of one drop of the resin when the stamper 2 and the patterned material 1 were pressed against each other. The resin was applied to the surface of the patterned material 1 and then the stamper 2 was pressed against the patterned material 1. Accordingly, the drop of the resin spread in an ellipse, which is 140 μm in the direction perpendicular to the groove pattern (in the radius direction of the patterned material 1) and 850 μm in the direction parallel to the groove pattern (in the circumferential direction of the patterned material 1). As a result, a pitch of the resin to be applied on the patterned material 1 was determined to be 80 μm in the radius direction and 510 μm in the circumferential direction in the range of diameter from 20 to 25 mm of the patterned material 1.

Then, the nitrogen gas was ejected from the openings of the flow paths H on the surface of the plate 3, and thereby the back surface of the patterned material 1 was separated from the front surface of the plate 3 and the front surface of the patterned material 1 was pressed against the front surface of the stamper 2. The ejected nitrogen gas passed through a space between the front surface of the plate 3 and the back surface of the patterned material 1, and then the nitrogen gas was discharge from a predetermined exhaust port (not shown). The pressure adjustment mechanisms B1, B2, B3, B4, and B5 control an amount of the nitrogen gas to be ejected, so that the pressure of the nitrogen gas ejected through each flow path H was set to be 0.5 MPa, 0.5 MPa, 0.45 MPa, 0.4 MPa, and 0.4 MPa in order from the inner circumference side of the plate 3. In this case, the applied pressure was highest on the edge of the central through-hole of the patterned material 1, and gradually becomes lower toward the outer circumference of the patterned material 1. Thereby, a contour line of the pressure distribution is defined in a concentric pattern on the patterned material 1.

While the patterned material 1 and the stamper 2 were pressed against each other, the resin applied to the patterned material 1 was irradiated with an ultraviolet light UV from a light source (not shown) arranged above the upper plate 3b. The resin was irradiated with the ultraviolet light UV through the stamper 2 so that the resin became cured. After the resin became cured, the pressure adjustment mechanisms B1, B2, B3, B4, and B5 reduced the pressure of the ejected nitrogen gas, so that the patterned material 1 sticks to the plate 3. Accordingly, the stamper 2 was separated from the patterned material 1. The thin film layer T1 (see FIG. 2D) was formed on the surface of the patterned material 1, and the pattern layer T2 (see FIG. 2D) including the groove patterns each having the width of 2 μm, the pitch of 4 μm, and the depth of 80 nm according to the fine pattern 2a (see FIG. 2D) formed on the surface of the stamper 2 was formed on the thin film layer T1 in a concentric pattern.

Five pieces of the patterned material 1 were fabricated according to the fourth example of the present invention. For the five pieces of the patterned material 1, portions of the surface of the patterned material 1 including the thin film layer T1 were removed in the radius direction at a 120-degree interval, so that a difference in level between the surface of the patterned material 1 and the surface of the thin film layer T1 was observed in the three directions on the surface of the patterned material 1 by the atom force microscope. In the patterned region of the patterned material 1, the average thickness of the thin film layer T1 for the five pieces was 7.5 nm and the standard deviation (σ) of the film thickness for the five pieces was 3.1 nm.

Fifth Example

An imprint device used in a fifth example had the same configuration as that of the imprint device A5 (see FIG. 6) used in the fourth example, except that the patterned material 1 was sandwiched between upper and lower stampers 2, 2 in the fifth example. In the fifth example, the fine patterns 2a were transferred to both surfaces of the patterned material 1.

In the fifth example, the resin was applied to the surface of the lower stamper 2 opposing the patterned material 1 and the surface of the patterned material 1 opposing the upper stamper 2. The nitrogen gas was ejected from the lower surface side of the lower stamper 2, so that the upper and lower stampers 2, 2 were pressed against both surfaces of the patterned material 1. Accordingly, the upper and lower stampers 2, 2 were separated from both surfaces of the patterned material 1. The thin film layers T1, T1 (see FIG. 2D) were formed on both surfaces of the patterned material 1. The pattern layers T2, T2 (see FIG. 2D) including the groove patterns each having the width of 2 μm, the pitch of 4 μm, and the depth of 80 nm according to the fine pattern 2a (see FIG. 2D) formed on the surface of the stamper 2 were formed on the thin film layers T1, T1 in a concentric pattern. The thickness of each of the thin film layers T1, T1 formed on both surfaces of the patterned material 1 was less than or equal to 20 nm.

Sixth Example

In a sixth example, the fine pattern was transferred to a substrate for a high-capacity magnetic recording medium (discrete track medium) by using the imprint device A5 (see FIG. 6) according to the fourth example.

In the sixth example, a glass disk substrate having the diameter of 27.4 mm, the thickness of 0.381 mm, and the central through-hole diameter of 7 mm was used as a patterned material 1.

A quartz substrate having the diameter of 27.4 mm, the thickness of 0.381 mm, and the central through-hole diameter of 7 mm was used as a stamper 2. Groove patterns each having the width of 50 nm, the depth of 80 nm and the pitch of 100 nm were formed on the stamper 2 in a concentric pattern by the conventional electron-beam direct writing technique. The groove patterns are arranged such that the central axes of the groove patterns correspond with the central axis of the central through-hole of the stamper 2. A releasing layer containing fluorine and having the thickness of 3 nm was formed on the surface of the stamper 2.

A resin was dropped to the surface of the patterned material 1 by the dispensing technique. The dropped resin had a photosensitive material added thereto and was prepared to have the viscosity of 4 cP (4 mPas). The resin was applied to the surface of the patterned material 1 by a coating head, which had 512 nozzles (2 rows each containing 256 nozzles) and ejected the resin by the piezo technique. The nozzles of the coating head are spaced at an interval of 70 μm in the row direction and 140 μm between the rows. Each of the nozzles ejected the resin of approximately 5 pL. The resin was applied on the patterned material 1 at the pitch of 150 μm in the radius direction and 270 μm in the circumferential direction.

In the same manner as the fourth example, the thin film layer T1 (see FIG. 2D) having the thickness of 10 nm on average was formed on the surface of the patterned material 1, and the pattern layer T2 (see FIG. 2D) including the groove patterns each having the width of 50 nm, the depth of 80 nm, and the pitch of 100 nm according to the fine pattern 2a (see FIG. 2D) formed on the surface of the stamper 2 was formed on the thin film layer T1.

Figure 7:
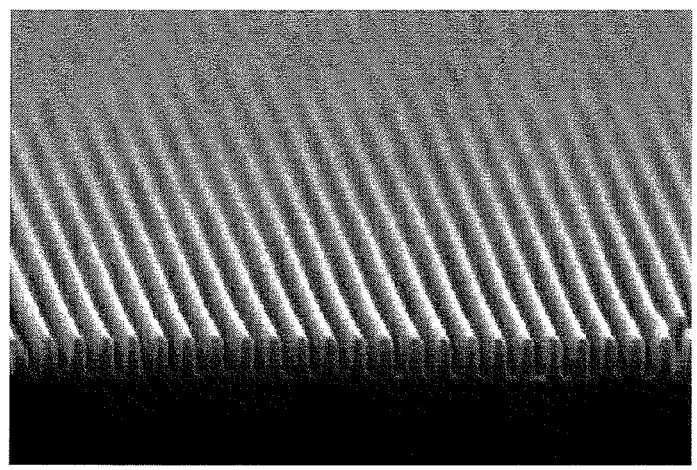
FIG. 7 is an electron microscope photograph showing a cross-sectional surface of a pattern formation layer having a thin film layer and a pattern layer.

FIG. 7 is an electron microscope photograph showing a cross-sectional surface of the pattern formation layer T3 (see FIG. 2D) having the thin film layer T1 and the pattern layer T2.

Seventh Example

In a seventh example, description will be provided for a method of manufacturing a discrete track medium by the microstructure transfer method according to the present invention with the drawings if necessary. Of the drawings to be referred to hereinafter, FIGS. 8A to 8D illustrate a manufacturing process of a discrete track medium.

Figure 8A:
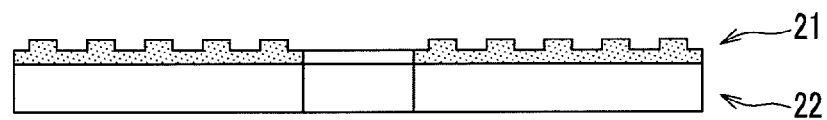
FIGS. 8A to 8D illustrate a manufacturing process of a discrete track medium.

As shown in FIG. 8A, there was prepared a glass substrate 22 having a pattern formation layer 21 formed thereon, as obtained in the sixth example. The pattern formation layer 21 was made of the photo curable resin 6 and had a surface structure of the stamper 2 transferred thereto.

Figure 8B:
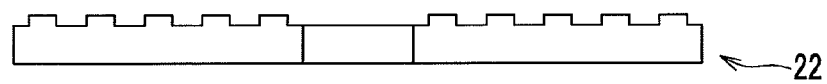

Next, a surface of the glass substrate 22 was processed by the conventional dry etching technique with the pattern formation layer 21 as a mask. As a result, as shown in FIG. 8B, a fine-patterned portion corresponding to the pattern of the pattern formation layer 21 was etched on the surface of the glass substrate 22. In the seventh example, fluorine-containing gas was used for the dry etching. The dry etching may be performed in such a manner that a thin film portion of the pattern formation layer 21 is etched and removed by the oxygen plasma etching, and then the exposed surface of the glass substrate 22 is etched with fluorine-containing gas.

Figure 8C:
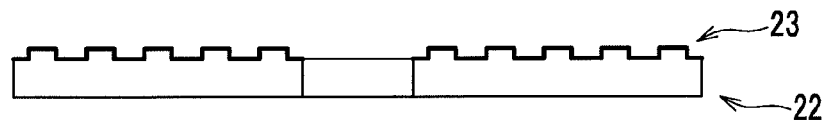

Then, as shown in FIG. 8C, on the glass substrate 22 with the fine-patterned portion formed thereon was formed a magnetic recording medium formation layer 23 including a pre-coat layer, a magnetic domain control layer, a soft magnetic underlayer, an intermediate layer, a perpendicular recording layer, and a protection layer by the DC magnetron sputtering technique (for example, see Japanese Laid-open Patent Application No. 2005-038596). The magnetic domain control layer included a nonmagnetic layer and an antiferromagnetic layer.

Figure 8D:
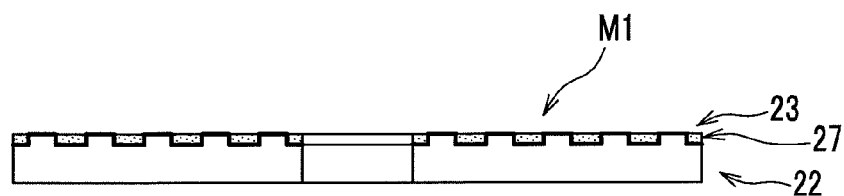

Next, as shown in FIG. 8D, a nonmagnetic material 27 was applied to a surface of the magnetic recording medium formation layer 23, so that the surface of the glass substrate 22 was flattened. As a result, a discrete track medium M1 having approximately 200 Gbpsi in terms of area density was manufactured.

Eighth Example

In an eighth example, description will be provided for another example of a method of manufacturing a discrete track medium by the microstructure transfer method according to the present invention with reference to the drawings if necessary. Of the drawings to be referred to hereinafter, FIGS. 9A to 9E illustrate a manufacturing process of a discrete track medium.

Figure 9A:
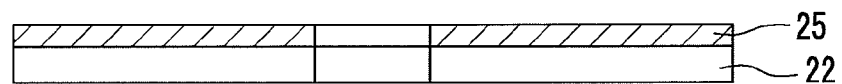
FIGS. 9A to 9E illustrate a manufacturing process of a discrete track medium.
Figure 9B:
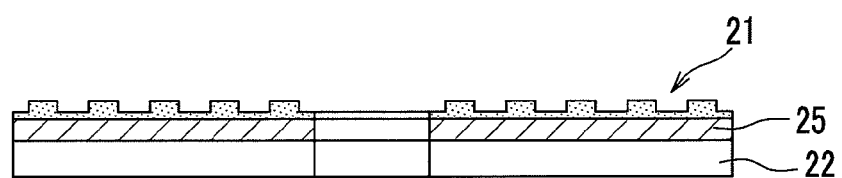

In the eighth example, the below-described substrate was prepared instead of the glass substrate 22 having the pattern formation layer 21 formed thereon as obtained in the first example. As shown in FIG. 9A, the substrate was obtained such that a soft magnetic underlayer 25 was formed on the glass substrate 22. Then, as shown in FIG. 9B, on the substrate was formed a pattern formation layer 21 made of the photo curable resin 6 and having the surface structure of the stamper 2 transferred thereto in the same manner as the first example.

Figure 9C:
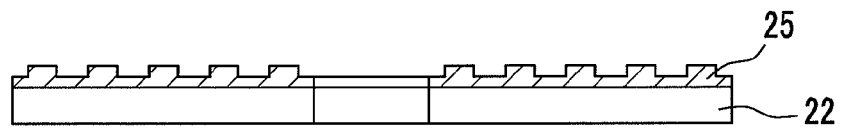

A surface of the soft magnetic under layer 25 was processed by the conventional dry etching technique with the pattern formation layer 21 as a mask. As a result, as shown in FIG. 9C, a fine-patterned portion corresponding to the pattern of the pattern formation layer 21 was etched on the surface of the soft magnetic under layer 25. In the eighth example, fluorine-containing gas was used for the dry etching.

Figure 9D:
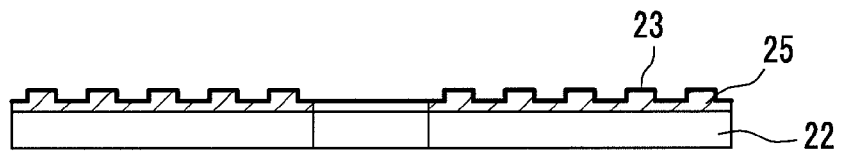

Then, as shown in FIG. 9D, on the surface of the soft magnetic underlayer 25 with the fine-patterned portion formed thereon was formed a magnetic recording medium formation layer 23 including a pre-coat layer, a magnetic domain control layer, a soft magnetic underlayer, an intermediate layer, a perpendicular recording layer, and a protection layer by the DC magnetron sputtering technique (for example, see Japanese Laid-open Patent Application No. 2005-038596). The magnetic domain control layer included a nonmagnetic layer and an antiferromagnetic layer.

Figure 9E:
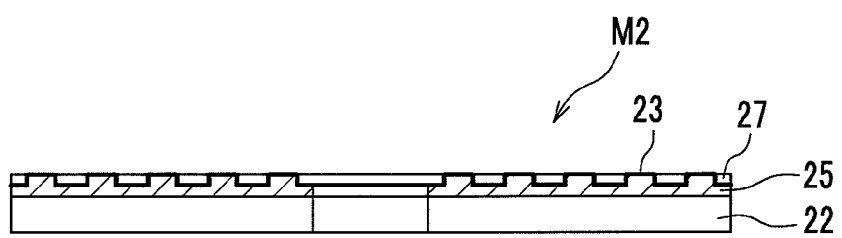

Next, as shown in FIG. 9E, a nonmagnetic material 27 was applied to a surface of the magnetic recording medium formation layer 23, so that the surface of the soft magnetic under layer 25 was flattened. As a result, a discrete track medium M2 having approximately 200 Gbpsi in terms of area density was manufactured.

Ninth Example

In an ninth example, description will be provided for a method of manufacturing a disk substrate for a discrete track medium by the microstructure transfer method according to the present invention with reference to the drawings if necessary. Of the drawings to be referred to hereinafter, FIGS. 10A to 10E illustrate a manufacturing process of a disk substrate for a discrete track medium.

Figure 10A:
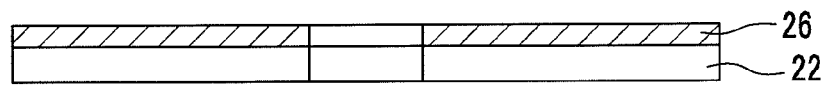
FIGS. 10A to 10E illustrate a manufacturing process of a disk substrate for a discrete track medium.
Figure 10B:
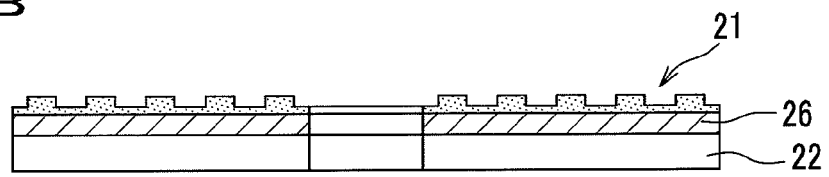

As shown in FIG. 10A, a novolak resin was previously applied to a surface of a glass substrate 22 to form a flat layer 26 on the glass substrate 22. The flat layer 26 may be formed, for example, by the spin-coating technique or a method of pressing the resin with a plate. Then, as shown in FIG. 10B, a pattern formation layer 21 was formed on the flat layer 26. The pattern formation layer 21 was formed by applying a silicone resin to a surface of the flat layer 26 and using the microstructure transfer method of the present invention.

Figure 10C:
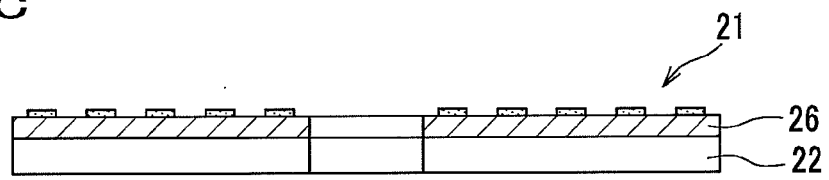
Figure 10D:
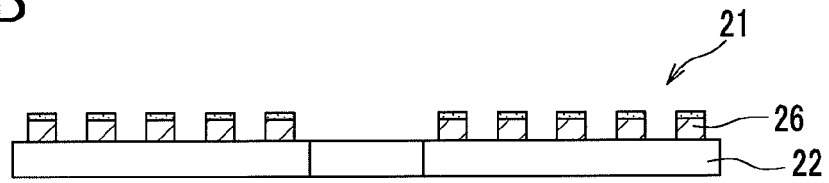
Figure 10E:
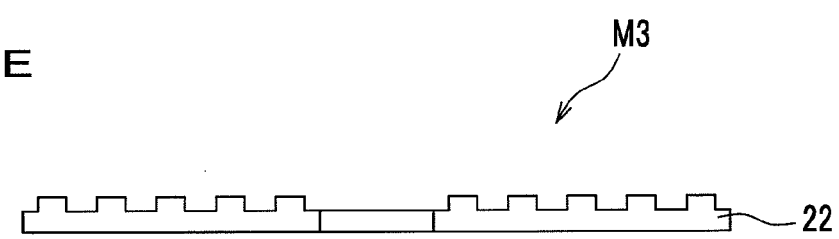

As shown in FIG. 10C, a thin film portion of the pattern formation layer 21 was etched and removed by the dry etching technique using fluorine-containing gas. Then, as shown in FIG. 10D, an exposed portion of the flat layer 26 was etched and removed with the remaining pattern formation layer 21 as a mask by the oxygen plasma etching. Then, the surface of the glass substrate 22 was etched with the fluorine-containing gas, and the pattern formation layer 21 and the flat layer 26 were removed. Thereby, a disk substrate M3 used for a discrete track medium having approximately 200 Gbpsi in terms of area density was manufactured.

Tenth Example

In an tenth example, description will be provided for another example of a method of manufacturing a disk substrate for a discrete track medium by the microstructure transfer method according to the present invention with reference to the drawings if necessary. Of the drawings to be referred to hereinafter, FIGS. 11A to 11E illustrate a manufacturing process of a disk substrate for a discrete track medium.

Figure 11A:
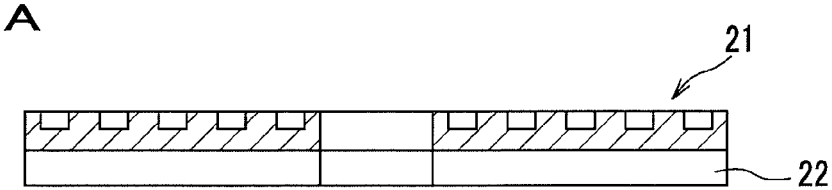
FIGS. 11A to 11E illustrate a manufacturing process of a disk substrate for a discrete track medium.
Figure 11B:
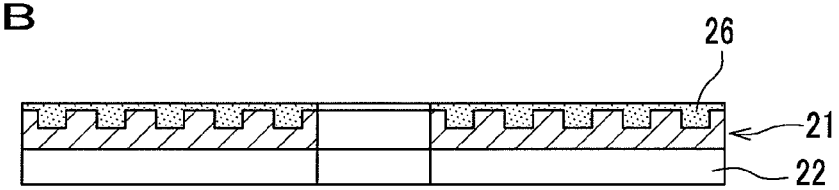
Figure 11C:
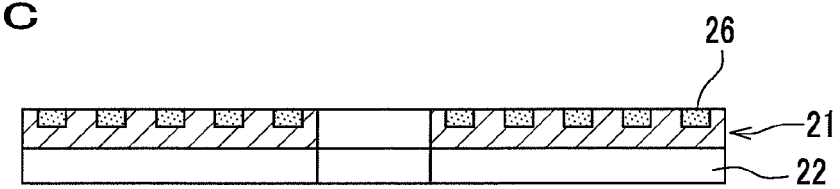
Figure 11D:
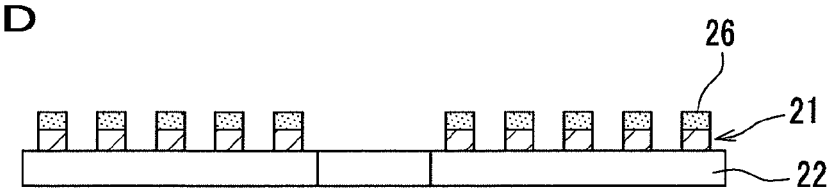
Figure 11E:
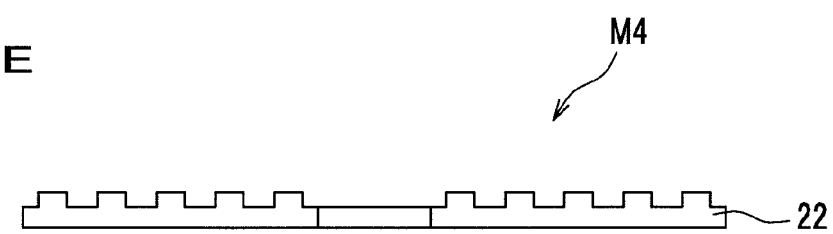

As shown in FIG. 11A, an acrylate resin having a photosensitive material added thereto was applied to a surface of a glass substrate 22, and thereby a pattern formation layer 21 was formed on the surface of the glass surface 22 according to the microstructure transfer method of the present invention. In the tenth example, on the glass substrate 22 was formed the pattern formation layer 21 having a fine pattern that is reverse to a fine pattern to be formed on the glass substrate 22. Next, as shown in FIG. 11B, a resin containing a silicone and a photosensitive material was applied to a surface of the pattern formation layer 21 to form a flat layer 26 on the pattern formation layer 21. The flat layer 26 may be formed, for example, by the spin-coating technique or a method of pressing the resin with a plate. Then, as shown in FIG. 11C, a surface of the flat layer 26 was etched with fluorine-containing gas, so that the upper surface of the pattern formation layer 21 was exposed. As shown in FIG. 11D, the exposed surface of the pattern formation layer 21 was etched and removed with the remaining flat layer 26 as a mask by the oxygen plasma etching, so that the upper surface of the glass substrate 22 was exposed. Then, as shown in FIG. 11E, the exposed surface of the glass substrate 22 was etched with fluorine-containing gas, and the pattern formation layer 21 and the flat layer 26 were removed. Thereby, a disk substrate M4 used for a discrete track medium having approximately 200 Gbpsi in terms of area density was manufactured.

Eleventh Example

In an eleventh example, description will be provided for an optical information processor manufactured by the microstructure transfer method of the present invention.

The eleventh example describes a case where an optical device for changing a traveling direction of an incident light was applied to an optical information processor used in an optical multiplexing communication system.

Figure 12:
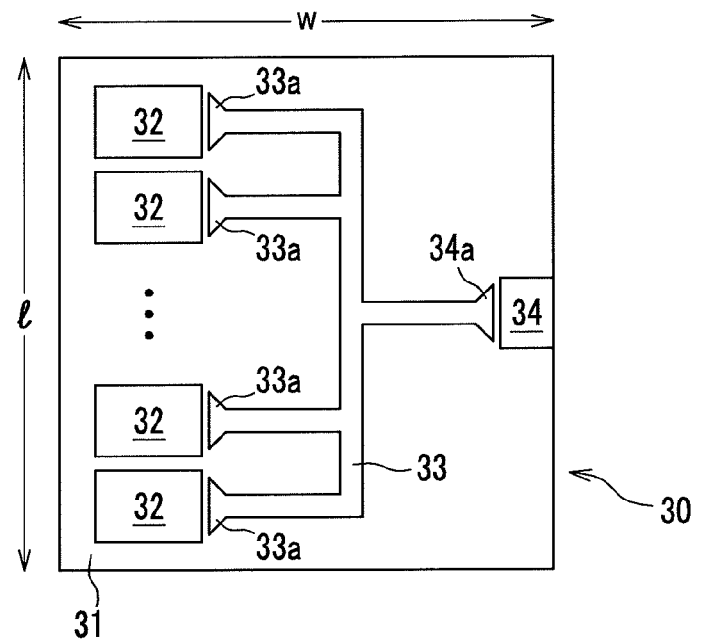
FIG. 12 is a schematic block diagram of an optical circuit as a basic component of an optical device.
Figure 13:
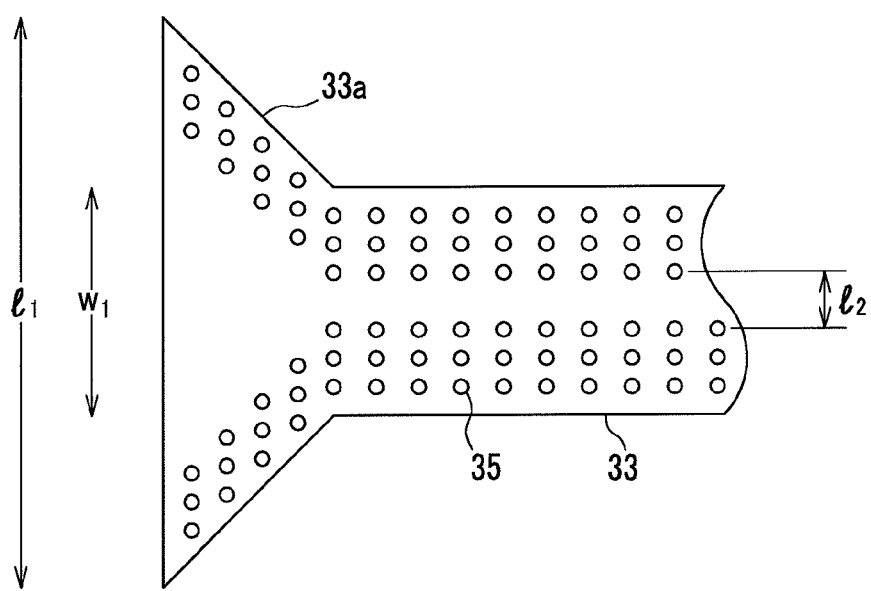
FIG. 13 is a schematic block diagram of a structure of a waveguide of an optical circuit.

FIG. 12 is a schematic block diagram of an optical circuit as a basic component of an optical device. FIG. 13 is a schematic block diagram of a structure of a waveguide of an optical circuit.

As shown in FIG. 12, an optical circuit 30 was formed on a substrate 31 made of aluminum nitride and having the length (l) of 30 mm, the width (w) of 5 mm and the thickness of 1 mm. The optical circuit 30 includes a plurality of oscillation units 32 each having an indium phosphorus-based semiconductor laser and a driver circuit, waveguides 33, 33$a$, and optical connectors 34, 34$a$. The semiconductor lasers are set to have different oscillation wavelengths from one another by 2 to 50 nm.

In the optical circuit 30, an optical signal is input from each of the oscillation units 32, and passes through the waveguides 33$a$ and 33. Then, the optical signal is transmitted to the optical connector 34 via the optical connector 34$a$. The optical signals input through the waveguides 33$a$ are multiplexed in the waveguide 33.

As shown in FIG. 13, a plurality of fine projections 35 is projectedly provided inside the waveguides 33. The waveguide 33a has an input section having the width $l_1$ of 20 µm and having a trumpet-shape as viewed in a plane cross section, so that it is possible to allow for an alignment error that occurs between the oscillation unit 32 and the waveguide 33. In the trumpet-shaped portion of the waveguide 33a, a group of the fine projections 35 are provided to form patterns such that an area in absence of the fine projections 35 becomes gradually narrower from the width $W_1$ on the input section side, and a signal light passes along the area in absence of the fine projections 35. The fine projections 35 are absent in one line in the middle of the straight portion of the waveguide 33. Thereby, a region $l_2$ free from a photonic band gap is provided, and thereby the optical signal is guided from the trumpet-shaped portion into the region $l_2$ having the width of 1 µm. A pitch between each fine projection 35 is set to be 0.5 µm. For simplification purposes, the number of the fine projections 35 illustrated in FIG. 13 is smaller than those actually arranged.

The present invention is applied to the waveguides 33, 33a and the optical connector 34a. Namely, the microstructure transfer method of the present invention is used for align the substrate 31 with the stamper 2 (see FIG. 1). The microstructure transfer method is utilized for forming the predetermined fine projections 35 in the predetermined waveguides 33, 33a and the predetermined optical connector 34a. The optical connector 34a has a right and left reversed (mirror symmetry) structure of the waveguide 33a of FIG. 13. An arrangement of the fine projections 35 in the optical connector 34a is mirror symmetry to that of the fine projections 35 in the waveguide 33a in FIG. 13.

An equivalent diameter (diameter or one side) of the fine projection 35 may be arbitrarily set in the range from 10 nm to 10 µm, depending on a wavelength of a light source used for a semiconductor laser. Preferably, the height of the fine projection 35 is set to be in the range from 50 nm to 10 µm. A distance (pitch) between each fine projection 35 is set to be approximately half a wavelength of a concerned optical signal. The above-described optical circuit 30, which outputs a plurality of optical signals having different wavelengths in a multiplexed manner, changes a light traveling direction, so that the width (w) (see FIG. 12) of the optical circuit 30 is reduced to 5 mm. Thereby, the optical device is reduced in size. In addition, according to the microstructure transfer method, the fine projections 35 is formed by transferring a surface structure of the stamper 2 (for example, see FIG. 1), and therefore it is possible to reduce manufacturing cost of the optical circuit 30.

The eleventh example describes the case where the present invention is applied to the optical device for multiplexing incident lights, but the present invention may be employed in any optical devices for controlling a light path.

Twelfth Example

In a twelfth example, description will be provided for a method of manufacturing a multilayer interconnection substrate by the microstructure transfer method according to the present invention. FIGS. 14A to 14L illustrate a process of manufacturing a multilayer interconnection substrate.

Figure 14A:
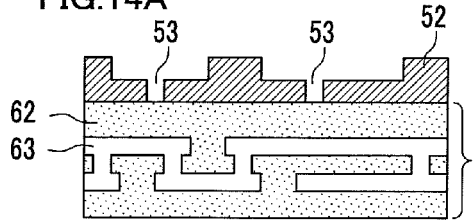
FIGS. 14A to 14L illustrate a process of manufacturing a multilayer interconnection substrate.

As shown in FIG. 14A, a resist 52 is formed on a surface of a multilayer interconnection substrate 61 including a silicon oxide film 62 and copper interconnections 63, and then a pattern of a stamper 2 (not shown) is transferred to the resist 52. The alignment of the stamper 2 and the substrate 61 is performed before the pattern of the stamper 2 is transferred to the resist 52, so that a desired interconnection pattern is transferred to a desired position of the substrate 61.

Figure 14G:
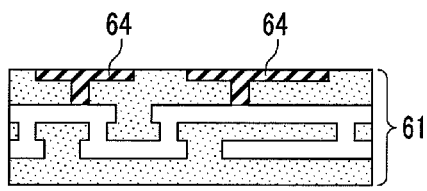
Figure 14B:
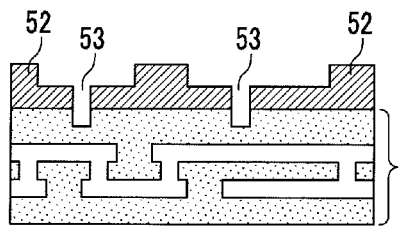

An exposed region 53 of the multilayer interconnection substrate 61 is dry-etched with $CF_4/H_2$ gas, so that grooves are formed on the exposed region 53 on the surface of the multilayer interconnection substrate 61, as shown in FIG. 14B. Next, the resist 52 is processed by RIE (Reactive Ion Etching). The resist 52 is etched until the resist 52 at a lower step is removed, and thereby the exposed region 53 of the multilayer interconnection substrate 61 becomes enlarged around the remaining resist 52, as shown in FIG. 14C. Then, the exposed region 53 is further processed by the dry etching, so that the grooves already formed on the exposed region 53 as illustrated in FIG. 14B are etched deeper enough to reach the copper interconnections 63, as shown in FIG. 14D.

Figure 14H:
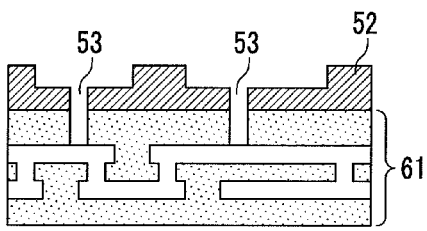
Figure 14C:
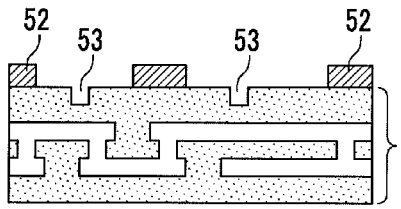
Figure 14I:
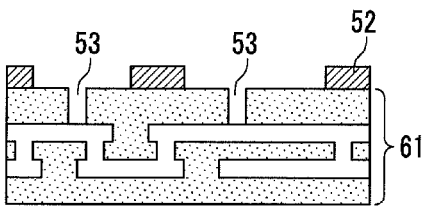
Figure 14D:
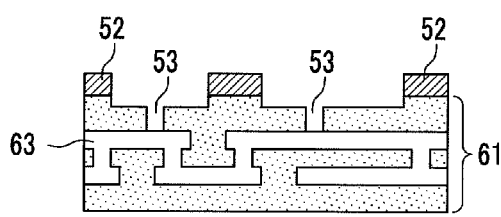
Figure 14J:
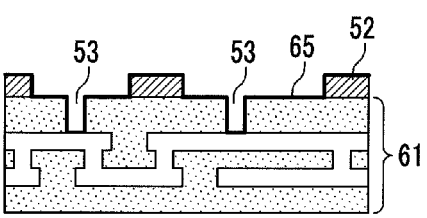
Figure 14E:
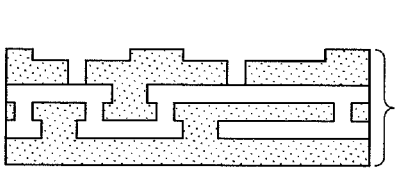
Figure 14K:
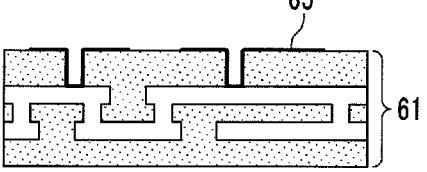
Figure 14F:
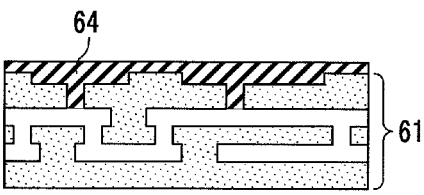
Figure 14L:
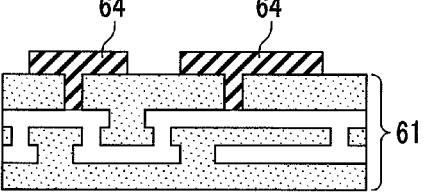

Next, as shown in FIG. 14E, the remaining resist 52 is removed so that the multilayer interconnection substrate 61 having the grooves on the surface thereof is fabricated. Then, a metal film (not shown) is formed on the surface of the multilayer interconnection substrate 61, and then a metal plated film 64 is formed on the resultant film by the electrolytic plating, as shown in FIG. 14F. Then, the metal plated film 64 is polished until the silicon oxide film 62 of the multilayer interconnection substrate 61 is exposed. As a result, as shown in FIG. 14G, the multilayer interconnection substrate 61 having metal interconnections of the metal plated film 64 on the surface thereof is fabricated.

Herein, description will be provided for another process of manufacturing the multilayer interconnection substrate 61.

The exposed region 53 as shown in FIG. 14A is processed by the dry etching until the exposed region 53 is etched deeper enough to reach the copper interconnections 63 inside the multilayer interconnection substrate 61, as shown in FIG. 14H. Next, the resist 52 is processed by RIE (Reactive Ion Etching), and as shown in FIG. 14I, the resist 52 at the lower step is removed. Then, a metal film 65 is formed on a surface of the multilayer interconnection substrate 61 by the sputtering technique, as shown in FIG. 14J. Then, the remaining resist 52 is removed by the lift-off technique, and thereby the metal film 65 partially remains on the surface of the multilayer interconnection substrate 61, as shown in FIG. 14K. Next, the partially remaining metal film 65 is subjected to nonelectrolytic plating, and thereby the multilayer interconnection substrate 61 having metal interconnections of the metal plated film 64 on the surface thereof is fabricated. As described above, the present invention may be applied to a manufacturing method of the multilayer interconnection substrate 61 so that it is possible to form metal interconnections with high dimensional precision.

What is claimed is:

1. An imprint device for transferring a fine pattern to a material to form a patterned material comprising:
    a stamper having the fine pattern thereon; and
    a pressure distribution mechanism,
    wherein opposed surfaces of the stamper and the material are pressed against one another, and
    the pressure distribution mechanism comprises a plate provided on a side of one of the stamper and the material opposite to the surface pressed against the other of the material and the stamper, the plate having a curved surface adjacent the one of the stamper and the material, and a buffer layer provided on and conforming to the curved surface such that the buffer layer has a curved surface corresponding to the curved surface of the plate, the buffer layer having a lower coefficient of elasticity than that of the plate, the stamper or the material, and having a thickness greater than a difference between a maximum thickness of the curved surface of the plate and a minimum thickness of the curved surface of the plate in an area of the plate having a diameter corresponding to a diameter of the material.

2. The imprint device according to claim 1, wherein the pressure distribution mechanism provides the pressure distribution having the highest pressure point in the patterned region.

3. The imprint device according to claim 1, wherein the pressure distribution mechanism defines a contour line of the highest pressure point in the patterned region, and the contour line defines a closed region in the patterned region.

4. The imprint device according to claim 1, wherein the pressure distribution mechanism changes the pressure distribution in the patterned region over time.

5. The imprint device according to claim 1, wherein the curved surface is a spherical surface having a constant curvature.

6. The imprint device according to claim 1 further comprising,
an alignment mechanism for aligning the stamper with the material before the stamper contacts the material.

7. The imprint device according to claim 1, wherein at least one of the stamper and the material is transparent.

8. The imprint device according to claim 1, wherein a releasing layer is formed on a surface of the fine pattern of the stamper.

9. The imprint device according to claim 1, wherein the pressure distribution mechanism provides a nonuniform pressure distribution in a patterned region of the patterned material, while the stamper is in contact with the material.

10. The imprint device according to claim 1, wherein the plate is provided on the side of the material opposite to the surface pressed against the stamper.

11. The imprint device according to claim 10, further comprising a second plate provided on the side of the stamper opposite to the surface pressed against the material.

12. The imprint device according to claim 11, wherein the second plate has a flat surface provided adjacent the side of the stamper opposite to the surface pressed against the material.

13. The imprint device according to claim 1, further comprising a second plate provided on the side of the other of the material and the stamper opposite to the surface pressed against the one of the stamper and the material.

14. The imprint device according to claim 13, wherein the second plate has a flat surface provided adjacent the side of the other of the material and the stamper opposite to the surface pressed against the one of the stamper and the material.

15. The imprint device according to claim 1, wherein the material to which the fine pattern is transferred is a liquid material.

16. The imprint device according to claim 15, wherein the material to which the fine pattern is transferred is a photo-curable resin.

17. The imprint device according to claim 1, wherein the material to which the fine pattern is transferred is a photo-curable resin.

18. The imprint device according to claim 17, further comprising a light source for irradiating the photo-curable resin to cure the photo-curable resin.

19. The imprint device according to claim 18, further comprising a unit for applying the photo-curable resin to the stamper.

20. The imprint device according to claim 19, wherein the unit for applying the photo-curable resin to the stamper is a dispenser.

21. The imprint device according to claim 19, wherein the unit for applying the photo-curable resin to the stamper is an inkjet head.

22. The imprint device according to claim 1, further comprising a unit for applying the material to the stamper.

23. The imprint device according to claim 22, wherein the unit for applying the material to the stamper is a dispenser.

24. The imprint device according to claim 22, wherein the unit for applying the material to the stamper is an inkjet head.

* * * * *